(12) United States Patent
Okamoto et al.

(10) Patent No.: US 8,637,951 B2
(45) Date of Patent: Jan. 28, 2014

(54) SEMICONDUCTOR LIGHT RECEIVING ELEMENT AND OPTICAL COMMUNICATION DEVICE

(75) Inventors: Daisuke Okamoto, Tokyo (JP); Junichi Fujikata, Tokyo (JP); Kenichi Nishi, Tokyo (JP)

(73) Assignee: NEC Corporation, Tokyo (JP)

( * ) Notice: Subject to any disclaimer, the term of this patent is extended or adjusted under 35 U.S.C. 154(b) by 477 days.

(21) Appl. No.: 12/811,863

(22) PCT Filed: Jan. 9, 2009

(86) PCT No.: PCT/JP2009/050203
§ 371 (c)(1),
(2), (4) Date: Aug. 2, 2010

(87) PCT Pub. No.: WO2009/088071
PCT Pub. Date: Jul. 16, 2009

(65) Prior Publication Data
US 2010/0308428 A1 Dec. 9, 2010

(30) Foreign Application Priority Data
Jan. 10, 2008 (JP) .................................. 2008-003182

(51) Int. Cl.
*H01L 31/0232* (2006.01)
*H01L 31/0352* (2006.01)
*H01L 31/0216* (2006.01)

(52) U.S. Cl.
USPC ........... 257/466; 257/432; 257/436; 257/437; 257/431; 257/E31.032; 257/E31.119; 257/E31.127

(58) Field of Classification Search
USPC .......... 257/466, 432, 436, 437, 431, E31.032, 257/E31.119, E31.127
See application file for complete search history.

(56) References Cited

U.S. PATENT DOCUMENTS

| | | | |
|---|---|---|---|
| 6,784,512 B2 * | 8/2004 | Yamaguchi et al. | 257/440 |
| 6,919,609 B2 * | 7/2005 | Lindemann et al. | 257/443 |
| 7,508,046 B2 * | 3/2009 | Nagai et al. | 257/459 |
| 7,873,090 B2 * | 1/2011 | Onishi et al. | 372/50.12 |
| 2003/0141507 A1 * | 7/2003 | Krames et al. | 257/79 |

FOREIGN PATENT DOCUMENTS

| | | | |
|---|---|---|---|
| JP | 2005159002 A | | 6/2005 |
| JP | 3726887 B | | 12/2005 |
| JP | 2007165359 A | * | 6/2007 |
| JP | 2007303927 A | | 11/2007 |
| JP | 2009038352 A | | 2/2009 |
| WO | 2005098966 A | | 10/2005 |
| WO | 2007105593 A | | 9/2007 |

OTHER PUBLICATIONS

International Search Report for PCT/JP2009/050203 mailed Apr. 14, 2009.

* cited by examiner

*Primary Examiner* — Matthew Reames
*Assistant Examiner* — Benjamin Tzu-Hung Liu

(57) ABSTRACT

A semiconductor light receiving element comprises: a substrate, a semiconductor layer of a first conductivity type formed on the substrate, a non-doped semiconductor light absorbing layer formed on the semiconductor layer of the first conductivity type, a semiconductor layer of a second conductivity type formed on the non-doped semiconductor light absorbing layer, and an electro-conductive layer formed on the semiconductor layer of the second conductivity type. A plurality of openings, periodically arrayed, are formed in a laminated body composed of the electro-conductive layer, the semiconductor layer of the second conductivity type, and the non-doped semiconductor light absorbing layer. The widths of the openings are less than or equal to the wavelength of incident light, and the openings pass through the electro-conductive layer and the semiconductor layer of the second conductivity type to reach the non-doped semiconductor light absorbing layer.

14 Claims, 13 Drawing Sheets

SEMICONDUCTOR LIGHT RECEIVING ELEMENT AND OPTICAL COMMUNICATION DEVICE

REFERENCE TO RELATED APPLICATION

This application is the National Phase of PCT/JP2009/050203, filed Jan. 9, 2009, which is based upon and claims the benefit of the priority of Japanese Patent Application No. 2008-003182 filed on Jan. 10, 2008, the disclosure of which is incorporated herein in its entirety by reference thereto.

TECHNICAL FIELD

The present invention relates to a semiconductor light receiving element and an optical communication device provided with the semiconductor light receiving element, and in particular relates to a semiconductor light receiving element that converts an optical signal, used in the fields of communication and information processing, into an electrical signal, and to an optical communication device provided with the semiconductor light receiving element.

BACKGROUND

In the fields of optical communication, optical information, and optical measurement, semiconductor light receiving elements are often used as photoelectric conversion elements. A principal factor that limits response speed of photoelectrical conversion in the semiconductor light receiving element is the time constant of a circuit, determined by the product of load resistance and electrical capacitance created by a depletion layer, and carrier travel time required for a carrier to pass through the depletion layer, and in order to improve high speed responsiveness of the semiconductor light receiving element, it is desired to decrease the time constant of the circuit and the carrier travel time.

As a means of decreasing the time constant of the circuit, for example, a means can be noted of reducing light receiving area and decreasing element capacitance. In a semiconductor light receiving element described in Patent Document 1, for the semiconductor light receiving element, which has a structure in which an i-type semiconductor light absorbing layer and a p-type semiconductor layer are stacked in this order on an n-type semiconductor substrate layer, by forming a plurality of opening regions reaching from the p-type semiconductor layer to the i-type semiconductor absorbing layer, effective pn junction area is reduced without reducing light receiving area, and capacitance reduction is aimed at.

Furthermore, in recent years, there have been many kinds of attempts in order to increase speed and realize high efficiency in the semiconductor light receiving element, using a metal surface plasmon or photonic crystal structure, as compared with the conventional situation (for example, refer to Patent Documents 2 to 4).

In a description in Patent Document 2, a Schottky photodiode that uses surface plasmons includes: a conductive film having a hole of a diameter smaller than the wavelength of incident light, and a periodic structure that causes a resonance state on a film surface by the surface plasmon that is excited, by the incident light on the film surface of the conductive film provided around the hole; and a semiconductor layer arranged to be in contact with the conductive film in the vicinity of the hole of the conductive film. The light incident on the periodic structure undergoes photoelectric conversion, by exciting surface plasmons, causing the resonance state with the surface plasmons, and generating near-field light at an interface between the conductive film and the semiconductor layer.

A surface plasmon strengthening photovoltaic device described in Patent Document 3 has a first metallic electrode, having a surface on which incident light is illuminated and a surface which is not illuminated, at least one of the illuminated surface and the non-illuminated surface is provided with apertures having a diameter not more than a wavelength of the incident light, forming a periodic surface topography, where an array of apertures has a strengthening characteristic causing resonance interaction between the incident light and surface plasmons on the surface; a second electrode disposed at a distance from the first metallic electrode; and a plurality of spheres disposed between the first metallic electrode and the second electrode corresponding to the array of apertures; wherein each sphere has a p-doped material first portion and an n-doped material second portion so that a p-n junction is formed at a junction between the first and the second portions, and each of the respective spheres is disposed within the apertures so that one of the first or the second portion is in electrical contact with the first metallic electrode, and the other of the first or the second portion is in electrical contact with the second electrode. The incident light resonates with the surface plasmons on the surface topography.

Furthermore, in order to increase light sensitivity, a light receiving element described in Patent Document 4 includes a semiconductor substrate, an n-type semiconductor layer disposed above the semiconductor substrate, an i-type semiconductor light absorbing layer disposed above an n-type contact layer and which absorbs light of a given wavelength band, and a p-type semiconductor layer disposed above the i-type semiconductor light absorbing layer, wherein the p-type semiconductor layer has periodically arrayed channels, holes, or columnar protrusions, includes a one dimensional or two dimensional photonic crystal part having a periodic refractive index distribution in a face intersecting the direction of incidence of light, and the photonic crystal part is formed so that at least a part of the incident light is even-number order diffracted light, and is distributed in a face of the light absorbing layer to be propagated.

[Patent Document 1]
JP Patent Kokai Publication No. JP-P2007-165359A
[Patent Document 2]
WO Pamphlet No. 2005/098966
[Patent Document 3]
JP Patent No. 3726887
[Patent Document 4]
JP Patent Kokai Publication No. JP-P2005-159002A

SUMMARY

The entire disclosures of Patent Documents 1 to 4 are incorporated herein by reference thereto. The following analysis is given from a viewpoint of the present invention.

In a semiconductor light receiving element, if a light receiving area is decreased and element capacitance is lowered, a time constant of a circuit decreases and it is possible to ensure high speed operation. However, in this case, since the light receiving area becomes small, a problem arises in that optical coupling with optic fiber or the like at high efficiency becomes difficult.

Accordingly, in the semiconductor light receiving element described in Patent Document 1, by forming plural opening regions passing from a p-type semiconductor layer through an i-type semiconductor light absorbing layer, the element capacitance is reduced without reducing the light receiving area. However, there is a trade-off problem in that, in order to get higher speed operation, if carrier travel time is decreased by making the semiconductor light absorbing layer thin, quantum efficiency decreases.

Devices described in Patent Document 2 and Patent Document 3 have a structure in which light is incident from a surface metal layer (electrode), but in this structure the proportion of the light reflected by the electrode before reaching the absorbing layer is high, and high photoelectric efficiency cannot be obtained. Furthermore, in manufacturing the device described in Patent Document 3, it is difficult to grow high grade crystal on the semiconductor substrate. As a result, it is difficult to apply the device described in Patent Document 3 to usages requiring high speed operation of optical communication or the like.

In a light receiving element described in Patent Document 4, since channels forming a photonic crystal part are only formed up to a midway portion of the p-type semiconductor layer, it is not possible to obtain an adequate capacitance reduction effect.

It is an object of the present invention to provide a semiconductor light receiving element with large light receiving area, high speed, and high efficiency, and an optical communication device having the semiconductor light receiving element.

According to a first aspect of the present invention there is provided a semiconductor light receiving element comprising: a substrate; a semiconductor layer of a first conductivity type formed on the substrate; a non-doped semiconductor light absorbing layer formed on the semiconductor layer of the first conductivity type; a semiconductor layer of a second conductivity type formed on the non-doped semiconductor light absorbing layer; and an electro-conductive layer (may be formed herein as "conductive layer") formed on the semiconductor layer of the second conductivity type. A plurality of openings, periodically arrayed, are formed in a laminated body composed of the electro-conductive layer, the semiconductor layer of the second conductivity type, and the non-doped semiconductor light absorbing layer. The widths of the openings are less than or equal to incident light wavelength. The openings pass through the electro-conductive layer and the semiconductor layer of the second conductivity type, and reach as far as the non-doped semiconductor light absorbing layer.

According to a preferable mode of the abovementioned first aspect, the plural openings are periodically arrayed such that surface plasmon resonance is generated at an interface of the electro-conductive layer and the semiconductor layer of the second conductivity type.

According to a preferable mode of the abovementioned first aspect, when the depth of the openings is d, the thickness of the electro-conductive layer is $t_1$, the thickness of the semiconductor layer of the second conductivity type is $t_2$, and the thickness of the non-doped semiconductor light absorbing layer is $t_3$, the depth d of the openings satisfies a condition: $t_1+t_2 \leq d \leq t_1+t_2+t_3/2$ According to a preferable mode of the abovementioned first aspect, the semiconductor light receiving element is further provided with a first electrode, formed on a semiconductor layer of the first conductivity type, and also electrically connected to the semiconductor layer of the first conductivity type. The electro-conductive layer is electrically connected to the semiconductor layer of the second conductivity type, and functions as a second electrode.

According to a preferable mode of the abovementioned first aspect, the semiconductor light receiving element is further provided with a first electrode, formed on a semiconductor layer of the first conductivity type, and also electrically connected to the semiconductor layer of the first conductivity type, and a second electrode, formed on a semiconductor of the second conductivity type, and also electrically connected to the semiconductor layer of the second conductivity type. The electro-conductive layer is formed on a semiconductor layer of the second conductivity type via an insulating layer, in a region where the second electrode is not formed, and the electro-conductive layer and the second electrode are not electrically connected.

According to a preferable mode of the abovementioned first aspect, at least a part of a face of the substrate, on a side opposite a face on which the semiconductor layer of the first conductivity type is formed, is formed in a lens shape.

According to a preferable mode of the abovementioned first aspect, the plurality of openings are periodically arrayed in a triangular grid form or a square grid form, and the surface shape of the openings is a circular form, an elliptical form, or a polygonal form.

According to a preferable mode of the abovementioned first aspect, the proportion of total area of the plurality of openings with regard to area (including area of the openings) of an upper face of the electro-conductive layer, is 50% or more, and 80% or less.

According to a preferable mode of the abovementioned first aspect, when the wavelength of incident light is $\lambda$, the refractive index of the semiconductor layer of the second conductivity type is n, and the period of the openings, which is the distance between centers of openings that are adjacent, is period P, $nP/\lambda$ satisfies either of the conditions of $0.9<nP/\lambda<1.1$, or $1.2<nP/\lambda<1.5$.

According to a preferable mode of the abovementioned first aspect, the semiconductor light receiving element is further provided with a Bragg reflection multi-layer film in a layer below the semiconductor layer of the first conductivity type.

According to a preferable mode of the abovementioned first aspect, the electro-conductive layer includes at least one metallic material (selected) from among Al, Ag, Au, and Cu.

According to a preferable mode of the abovementioned first aspect, the non-doped semiconductor light absorbing layer is formed from at least one selected from the group of Si, $Si_x Ge_{1-x}$ (note that x is a positive number less than 1), Ge, GaN, GaAs, GaInAs, GaInP, and InP.

According to a preferable mode of the abovementioned first aspect, the semiconductor light receiving element is further provided with an antireflective film or a protective film on the electro-conductive layer.

According to a second aspect of the present invention, an optical communication device having a semiconductor light receiving element is provided. The semiconductor light receiving element is provided with a substrate; a semiconductor layer of a first conductivity type formed on the substrate; a non-doped semiconductor light absorbing layer formed on the semiconductor layer of the first conductivity type; a semiconductor layer of a second conductivity type formed on the non-doped semiconductor light absorbing layer; and an electro-conductive layer formed on the semiconductor layer of the second conductivity type. A plurality of openings, periodically arrayed, are formed in a laminated body composed of the electro-conductive layer, the semiconductor layer of the second conductivity type, and the non-doped semiconductor light absorbing layer. The widths of the openings are less than or equal to the wavelength of incident light. The openings pass through the electro-conductive layer and the semiconductor layer of the second conductivity type, and reach as far as the non-doped semiconductor light absorbing layer.

According to a preferable mode of the abovementioned second aspect, the semiconductor light receiving element is disposed so that light is incident from the substrate side.

The present invention possesses at least one among the following effects.

In the present invention, light that is incident on a conductive layer (or a second electrode) having periodic openings excites surface plasmons at a semiconductor interface with the conductive layer, and forms a resonance state. As a result, a strong electrical field is generated inside a non-doped semiconductor light absorbing layer, and absorption is effectively performed with regard to a thin non-doped semiconductor light absorbing layer. In this way, it is possible to get high quantum efficiency even for a case where the light absorbing layer is thin. Furthermore, since plural openings are provided, it is possible to decrease element capacitance per unit area. In this way, it is possible to realize higher speeds. In addition, since it is possible to maintain light receiving area even when element capacitance is lowered, it is possible to facilitate alignment with optic fiber and the like. Therefore, according to the present invention, a semiconductor light receiving element and an optical communication device having high efficiency, high speed, and high applicability are realized.

Furthermore, according to the present invention, since the semiconductor light receiving element that has high speed and high efficiency can be realized using Ge having good compatibility with a Si CMOS process, high integration and mass production are facilitated and it is possible to reduce manufacturing cost.

As for explanations of symbols, please refer to the end of the description.

PREFERRED MODES

Figure 1:
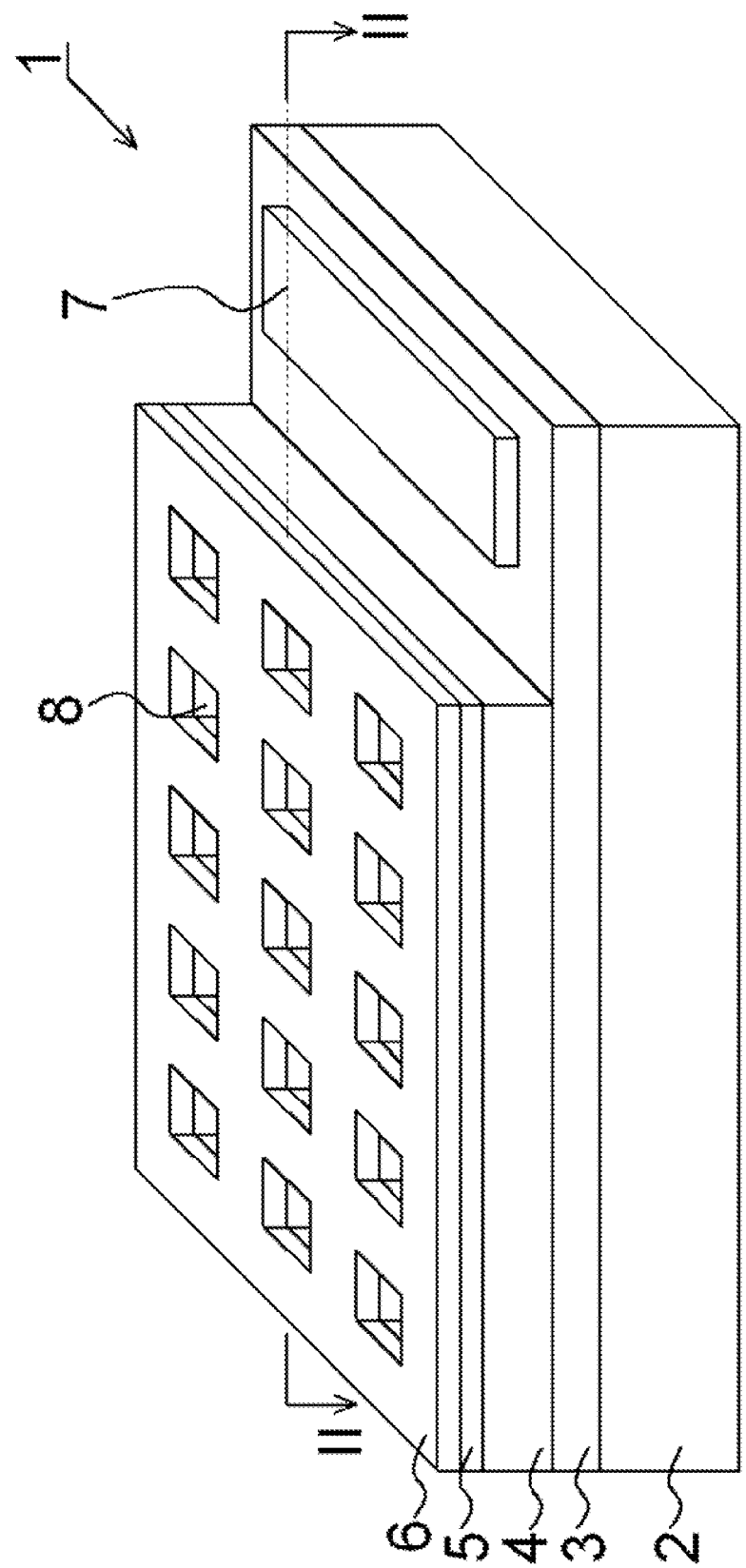
FIG. 1 is an outline perspective view of a semiconductor light receiving element according to a first exemplary embodiment of the present invention.
Figure 2:
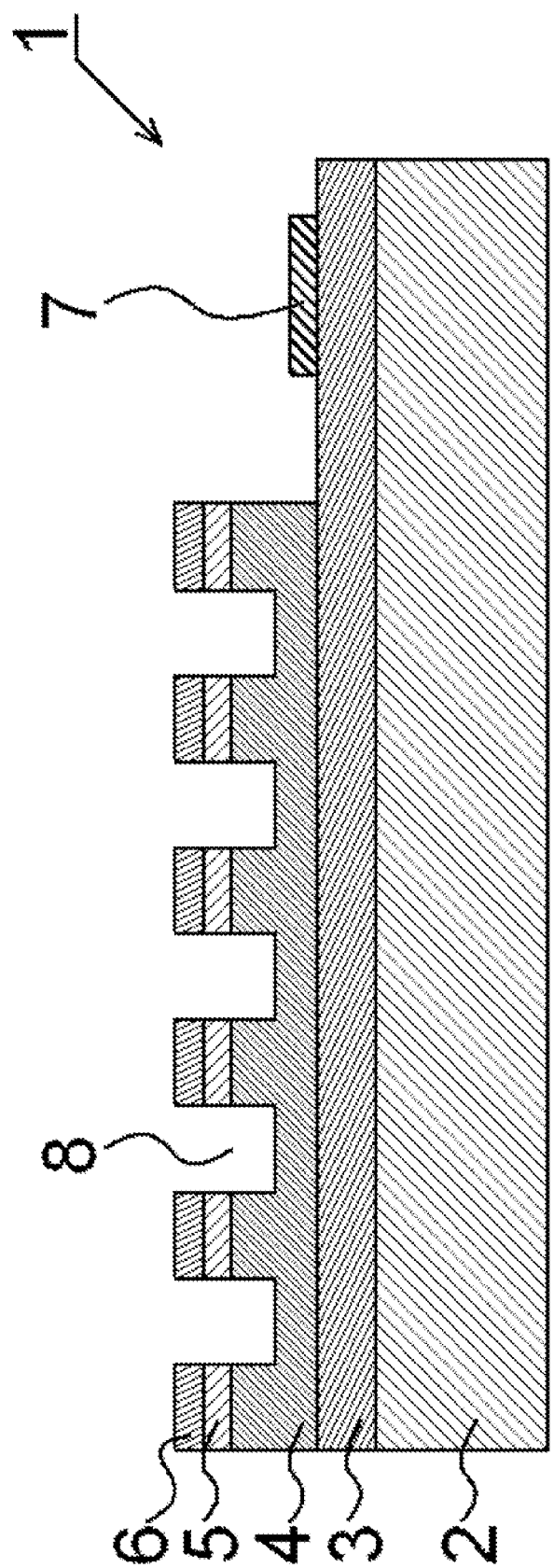
FIG. 2 is an outline cross-sectional view at a line II-II in FIG. 1.

FIG. 1 describes a semiconductor light receiving element according to a first exemplary embodiment of the present invention. FIG. 1 shows an outline perspective diagram of the semiconductor light receiving element according to the first exemplary embodiment of the present invention. FIG. 2 is an outline cross-sectional diagram along a line II-II in FIG. 1.

The semiconductor light receiving element 1 of the present invention includes, in sequence from a lower layer, a substrate 2, a semiconductor layer of a first conductivity type 3, a non-doped semiconductor light absorbing layer 4, and a semiconductor layer of a second conductivity type 5; and the semiconductor layer 3 of the first conductivity type, the non-doped semiconductor light absorbing layer 4, and the semiconductor layer 5 of the second conductivity type form a pin (or nip) semiconductor laminated structure. Furthermore, the semiconductor light receiving element 1 includes a second electrode (conductive layer) 6, electrically connected to the semiconductor layer 5 of the second conductivity type, on the semiconductor layer 5 of the second conductivity type, and a first electrode 7, electrically connected to the semiconductor layer 3 of the first conductivity type, on the semiconductor layer 3 of the first conductivity type. The second electrode 6 is formed on the semiconductor layer 5 of the second conductivity type, and fulfils a role of a conductive layer inducing surface plasmon resonance. When a reverse bias voltage is applied to the first electrode 7 and the second electrode 6, the non-doped semiconductor light absorbing layer 4 is depleted, and a photocarrier generated by the non-doped semiconductor light absorbing layer 4 is extracted to an external circuit as a photocurrent and converted to an electrical signal.

In addition, the semiconductor light receiving element 1 has a plurality of openings 8 that pass through the second electrode 6 and the semiconductor layer 5 of the second conductivity type, to reach the non-doped semiconductor light absorbing layer 4. The openings 8 are arrayed periodically. In the exemplary embodiment shown in FIG. 1, a form of the openings 8 in a planar projection on a face of the second electrode 6 is square, and the openings 8 are arranged periodically in a square grid. When light is made incident on the second electrode 6, the openings 8 that are disposed periodically can induce the surface plasmon resonance at an interface of the second electrode 6 and the semiconductor layer 5 of the second conductivity type.

Figure 3:
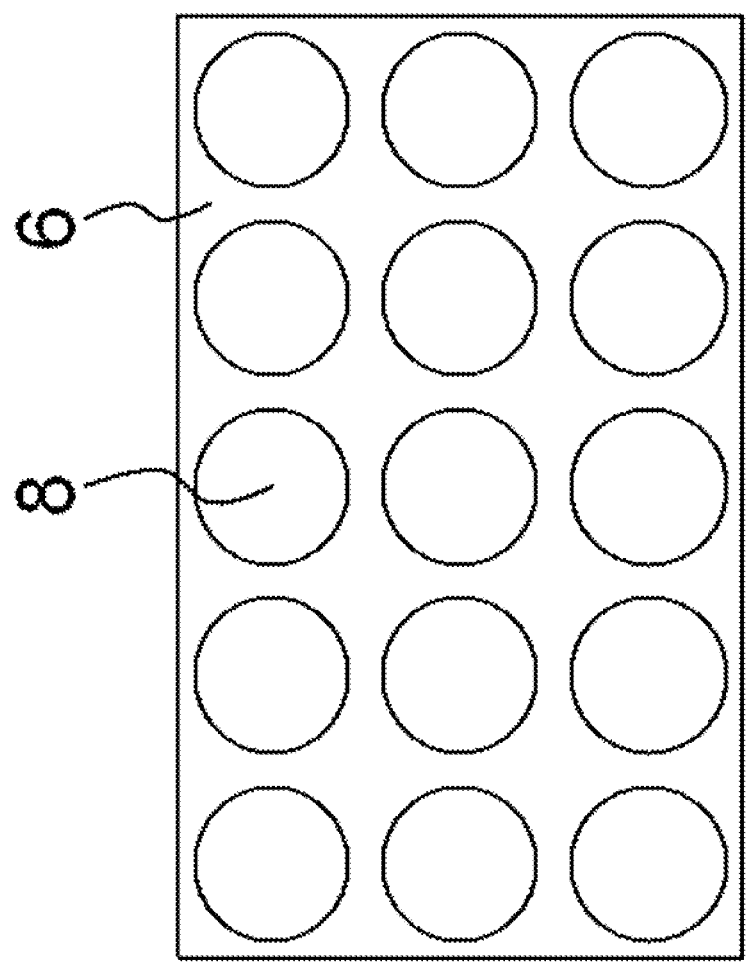
FIG. 3 is an outline planar view showing another exemplary embodiment of openings.
Figure 4:
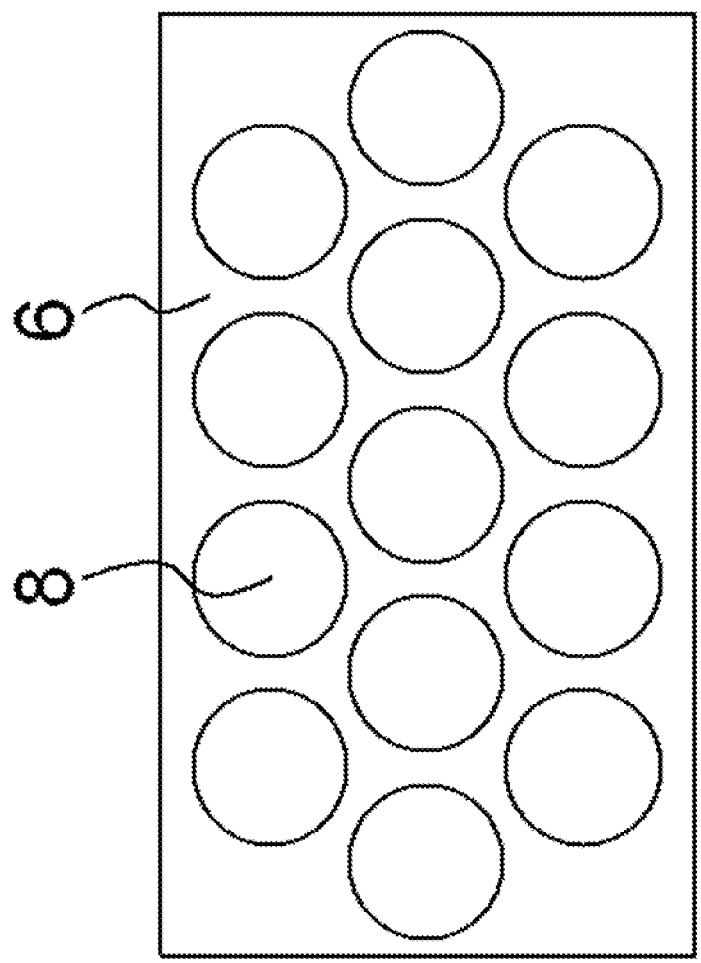
FIG. 4 is an outline planar view showing another exemplary embodiment of the openings.

FIG. 3 and FIG. 4 show outline planar views indicating other exemplary embodiments of the openings 8. The planar form of the openings 8, besides the square shape, may be a polygonal shape, and may, for example, be of an elliptical shape or a circular shape, as shown in FIG. 3. Furthermore, the array exemplary embodiment of the openings 8, besides the square grid form as shown in FIG. 1 and FIG. 3, may, for example, be a periodic array of a triangular grid form as shown in FIG. 4.

The size of the respective openings 8 in the planar projection is arranged to be a size less than or equal to incident wavelength. A portion that is the size of the openings 8 is preferably the broadest (longest) portion of the openings, for example, preferably a diagonal line in a case of square shaped openings, and a diameter in a case of circular openings. Furthermore, in order to lower element capacitance, the proportion of total area occupied by the openings 8 in the second electrode 6 plane is preferably as large as possible with respect to the area of the second electrode 6. For example, if the proportion of the total area occupied by the openings 8 with respect to the area (including the openings 8) of the second electrode is 50% or more, it is possible to obtain an effect of a remarkable element capacitance reduction. A reduction in quantum efficiency by increasing the proportion of the area of the openings 8 can be prevented by using a surface plasmon resonance effect by the second electrode 6, but an upper limit to the proportion of the area of the openings 8 is preferably set as appropriate according to desired quantum efficiency and element capacitance, and can be set to 80% or less, for example.

The openings 8 can be formed by a general processing method, for example, wet etching or dry etching. For example, the second electrode 6 is formed having an opening pattern using a liftoff process on the semiconductor laminated structure 3, 4, and 5, and with the formed second electrode 6 as a mask, it is possible to form openings also in the semiconductor layer 5 of the second conductivity type and the non-doped semiconductor light absorbing layer 4.

Figure 5:
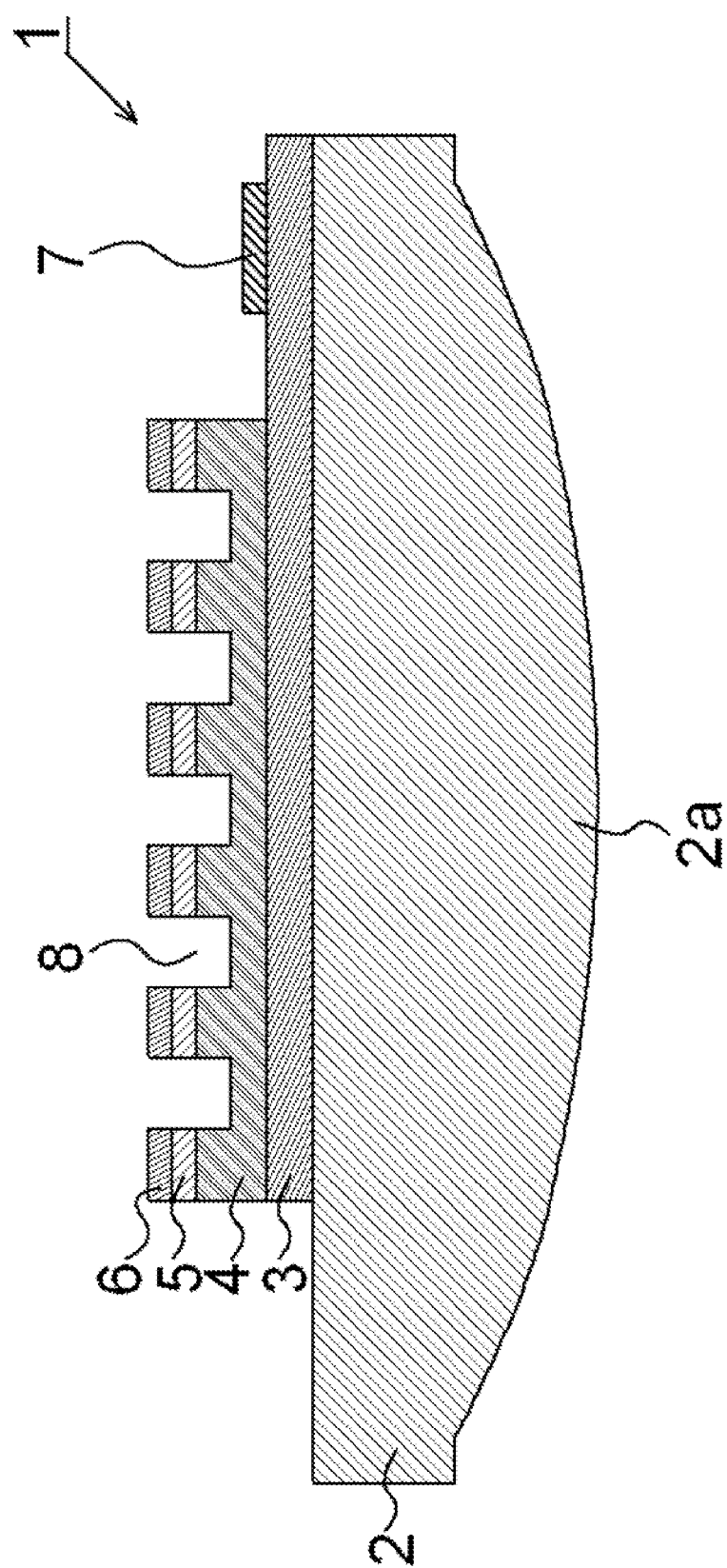
FIG. 5 is an outline cross-sectional diagram showing one mode according to the first exemplary embodiment of the present invention.

A direction of incidence of light on the semiconductor light receiving element 1 may be from the second electrode 6 face side, or may be from the substrate 2 face side, but for each case it is possible to obtain a similar surface plasmon resonance effect. In particular, in the case of incidence from the substrate 2 face side, the incident light hardly passes through the openings 8 that have a size of less than or equal to the wavelength, and in addition, since the second electrode 6 also fulfils a role as a mirror, higher efficiency is obtained and this is particularly preferable. In the case of the light being incident from the substrate 2 face side, focusing may be done using another lens as in a fourth exemplary embodiment described below, or, as shown in FIG. 5, a convex portion 2a (lens shape) may be formed on the substrate 2 face on a side opposite to the semiconductor layers 3 to 5, to give a lens function to the substrate 2 itself.

Figure 6:
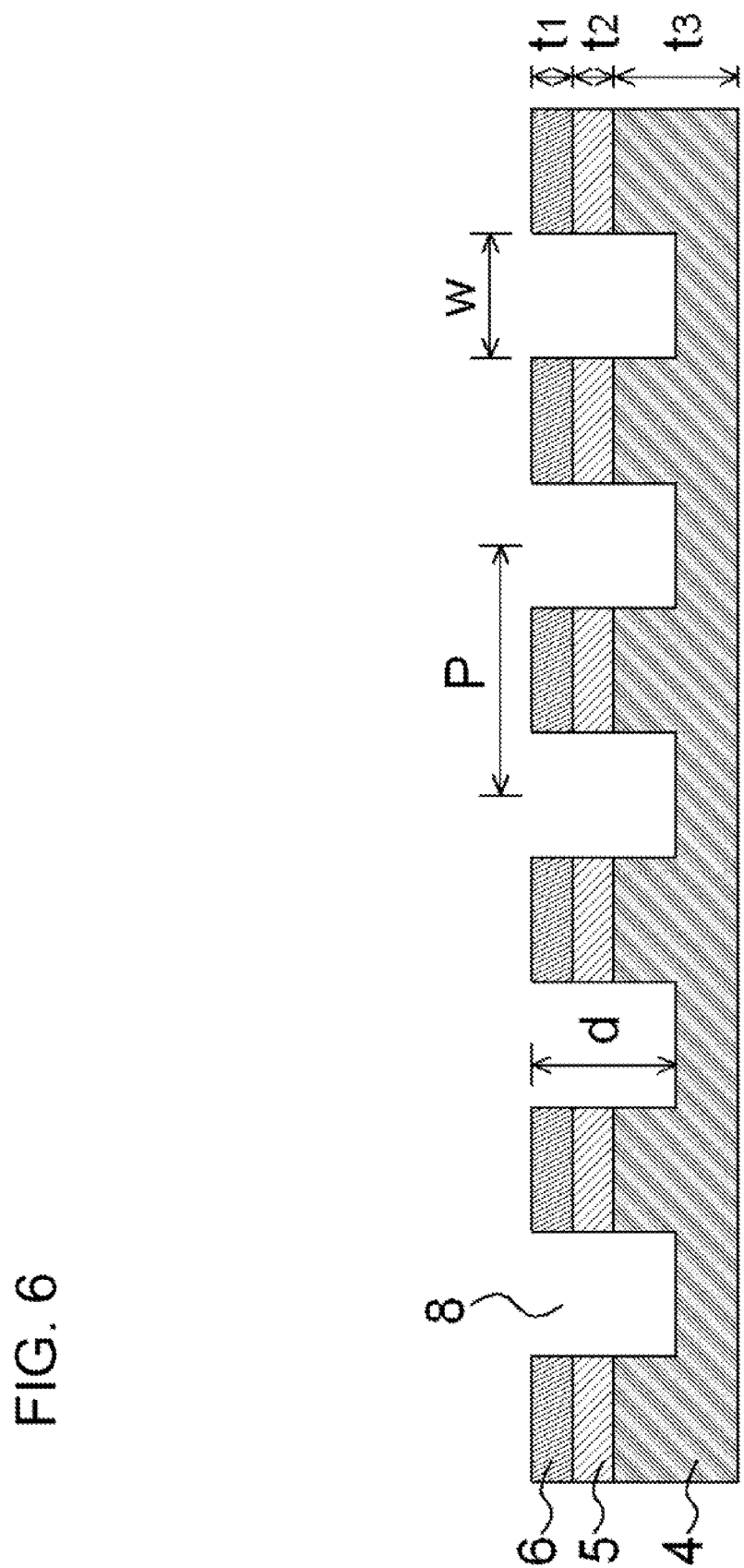
FIG. 6 is an outline partial cross-sectional view of FIG. 2.

In order that light incident on the second electrode 6 efficiently combines with the surface plasmons, the period P of the openings 8 is a very important parameter. FIG. 6 shows an outline partial cross-sectional view of the non-doped semiconductor light absorbing layer 4, the semiconductor layer 5 of the second conductivity type, and the second electrode 6 portion of the semiconductor light receiving element 1 shown in FIG. 2. Here, if distance between centers of adjacent openings 8 is period P, the wavelength of the incident light in a vacuum is $\lambda$, and refractive index of the semiconductor layer 5 of the second conductivity type is n, then $nP/\lambda$ preferably satisfies the condition of $0.9 < nP/\lambda < 1.1$ or $1.2 < nP/\lambda < 1.5$. If $nP/\lambda$ is within this range, it is possible to obtain a high quantum efficiency.

Furthermore, opening depth d (depth of the openings 8 reaching from the second electrode 6 as far as the non-doped semiconductor light absorbing layer 4) is an important parameter with respect to quantum efficiency and high frequency characteristic of the semiconductor light receiving element 1 of the present invention. Since an electrical field is small in a portion of the openings 8, the carrier travel time occurring in this portion is long and a high speed response is impeded. Therefore, in order to obtain a high speed response, it is more advantageous to form the openings 8 also in the non-doped semiconductor light absorbing layer 4. However, since the quantum efficiency decreases a little in this case, in order to have both efficiency and high speed characteristics, it is preferable that the depth of the openings 8 be shallower than approximately the middle of the non-doped semiconductor light absorbing layer 4. That is, when the depth of the openings 8 is d, the thickness of the second electrode 6 is $t_1$, the thickness of the semiconductor layer 5 of the second conductivity type is $t_2$, and the thickness of the non-doped semiconductor light absorbing layer 4 is $t_3$, the depth d of the openings 8 preferably fulfills: $t_1+t_2 \leq d \leq t_1+t_2+t_3/2$. It is to be noted that in a case where an insulating layer or the like is further interposed, as in a second exemplary embodiment described below, the thickness of the insulating layer and the like is also added to the depth d of the openings.

As a material of the second electrode 6, an electro-conductive metal is preferable, and it is possible to use a metal such as Al, Cu, or the like, which are widely used in semiconductor devices and for which many processing technologies have been established; in particular, a metal such as Au, Ag, or the like, which have low electrical resistance and for which surface plasmon loses are small, are especially preferable.

It is also possible to provide a metal layer such as Ti, Ta, Cr, W, Ni, Pt, or the like, as an adhesion layer or a barrier layer between the second electrode 6 and the semiconductor layer 5 of the second conductivity type. Film thickness of the adhesion layer or the barrier layer is preferably 20 nm or less, in order that optical loss is small. Furthermore, a protective film or an antireflective film formed from an insulating body may be provided on a surface of the second electrode 6 (formation may be done on an inner face of the openings 8). $SiO_2$, SiON, SiN, or the like, with which a stable film can be easily obtained, are preferable as a material for this antireflective film or protective film.

The semiconductor layer 5 of the second conductivity type, the non-doped semiconductor light absorbing layer 4, and the semiconductor layer 3 of the first conductivity type may be configured as a laminated structure of a plurality of semiconductor materials, and it is possible to select an optimal material according to incident light wavelength or substrate on which the semiconductor light receiving element 1 is made. For example, it is possible to select at least one semiconductor material selected from the group of Si, $Si_xGe_{1-x}$ (note that x is positive number less than 1), Ge, GaN, GaAs, GaInAs, GaInP, and InP, as the non-doped semiconductor light absorbing layer 4. In a case of using InP as a material of the substrate 2, for example, it is possible to use InP in the semiconductor layer 3 of the first conductivity type, InGaAs in the non-doped semiconductor light absorbing layer 4, and InAlAs in the semiconductor layer 5 of the second conductivity type. Furthermore, for example, in a case of using Si as the material of the substrate 2, it is possible to use Si in the semiconductor layer 3 of the first conductivity type and the semiconductor layer 5 of the second conductivity type, and $Si_xGe_{1-x}$ or Ge in the non-doped semiconductor light absorbing layer 4.

In the present invention, as a combination of the first conductivity type and the second conductivity type, a p-i-n type structure is possible in which the semiconductor layer 3 of the first conductivity type is an n-type semiconductor and the semiconductor layer 5 of the second conductivity type is a p-type semiconductor; or an n-i-p type structure is possible in which the semiconductor layer 3 of the first conductivity type is a p-type semiconductor and the semiconductor layer 5 of the second conductivity type is an n-type semiconductor.

Next, a description is given using FIG. 1 and FIG. 2 concerning a first example of the semiconductor light receiving element 1 according to the first exemplary embodiment of the present invention. An n-type InP layer 3 as the semiconductor layer of the first conductivity type, an i-type InGaAs layer 4 as the non-doped semiconductor light absorbing layer, and a p-type InAlAs layer 5 as the semiconductor layer of the second conductivity type are laminated on the InP substrate 2 as the substrate. All of these semiconductor layers 3, 4, and 5 can be grown using a molecular beam epitaxy or organometallic vapor-phase growth method. A Ti/Pt/Au-p electrode 6 is formed as the second electrode on a surface of the p-type InAlAs layer 5. Furthermore, a part of a surface of the n-type InP layer 3 is exposed by etching, and a Ti/Pt/Au-n electrode 7 is formed as the first electrode on the exposed face. A preferred ohmic junction is formed between the electrodes 7 and 6, and the semiconductor layers 3 and 5. The plurality of openings 8 that are periodically arrayed are formed in the Ti/Pt/Au-p electrode 6, the p-type InAlAs layer 5, and the i-type InGaAs layer 4. The openings 8 pass through the Ti/Pt/Au-p electrode 6 and the p-type InAlAs layer 5, and reach as far as the middle of the i-type InGaAs layer 4. If a reverse bias voltage is applied to the semiconductor light receiving element 1, the i-type InGaAs layer 4 is depleted. When the incident light wavelength is, for example, 1.3 µm or 1.55 µm used in optical communication, the i-type InGaAs layer 4 has an adequately large absorption coefficient, and a semiconductor light receiving element of high efficiency becomes possible. Furthermore, the InP is a transparent material that does not absorb the wavelength in question, and it is possible to have incident light from the InP substrate 2 side.

Figure 7:
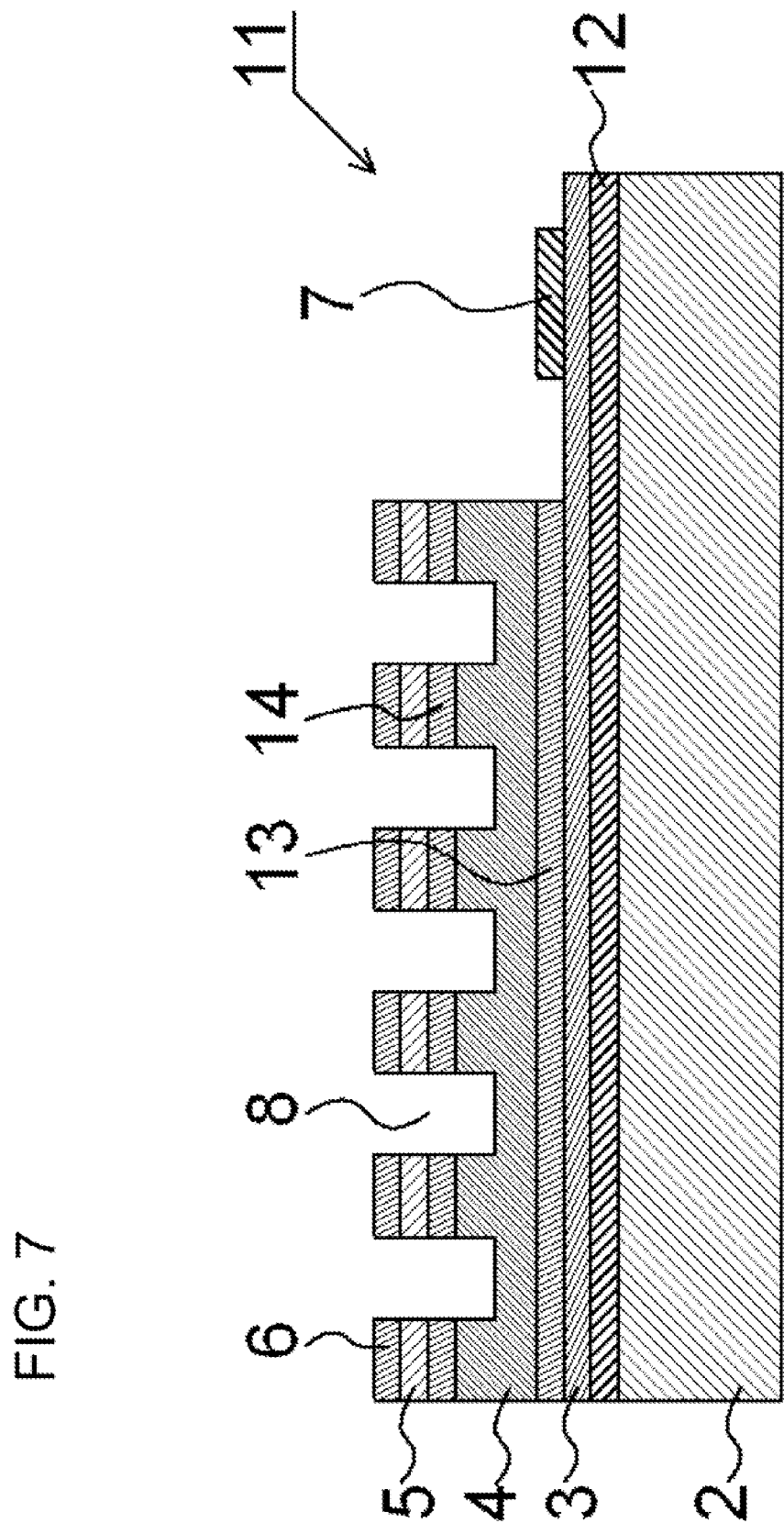
FIG. 7 is an outline cross-sectional view of a second example of a semiconductor element according to the first exemplary embodiment of the present invention.

Next, a description is given concerning a second example of the semiconductor light receiving element according to a first exemplary embodiment of the present invention. FIG. 7 shows an outline cross-sectional view of the second example of the semiconductor element according to the first exemplary embodiment of the present invention. The semiconductor light receiving element 11 is based on the first exemplary embodiment of the invention, however the semiconductor material is different from the semiconductor light receiving element according to the first example. An n-type Si layer 3 is formed as a semiconductor layer of a second conductivity type on a Si substrate 2 as a substrate that includes an embedded oxide layer 12; thereon a SiGe buffer layer 13 is formed; thereon an i-type Ge layer 4 is provided as a non-doped semiconductor light absorbing layer; thereon a SiGe buffer layer 14 is formed; and thereon a p-type Si layer 5 is formed as a semiconductor layer of a second conductivity type. By providing the SiGe buffer layers 13 and 14 on the n-type Si layer 3 and the i-type Ge layer 4, respectively, it is possible to perform epitaxial growth of the i-type Ge layer 4 and the p-type Si layer 5 having a reduced amount of crystal defects. On a surface of the p-type Si layer 5, a Cr/Ag-p electrode 6 is formed as the second electrode, and on a surface of the n-type Si layer 3, a Cr/Ag-n electrode 7 is formed as the first electrode. A plurality of openings 8 that are periodically arrayed are formed on/in the Cr/Ag-p electrode 6, the p-type Si-type layer 5, the SiGe buffer layer 13 and the i-type Ge layer 4. The openings 8 pass through the Cr/Ag-p electrode 6, the p-type Si-type layer 5, and the SiGe buffer layer 13, and reach as far as the middle of the i-type InGaAs layer 4. In a case of using the i-type Ge layer 4 as the non-doped semiconductor light absorbing layer, the semiconductor light receiving element 11 of the present invention operates with regard to incident light of 1.3 µm or 1.55 µm, and for this wavelength band the Si is a non-absorbing transparent material. In the second example, by using the i-type Ge layer 17 as a non-doped semiconductor light absorbing layer, there is an advantage in that compatibility with Si processing in manufacturing improves.

Figure 8:
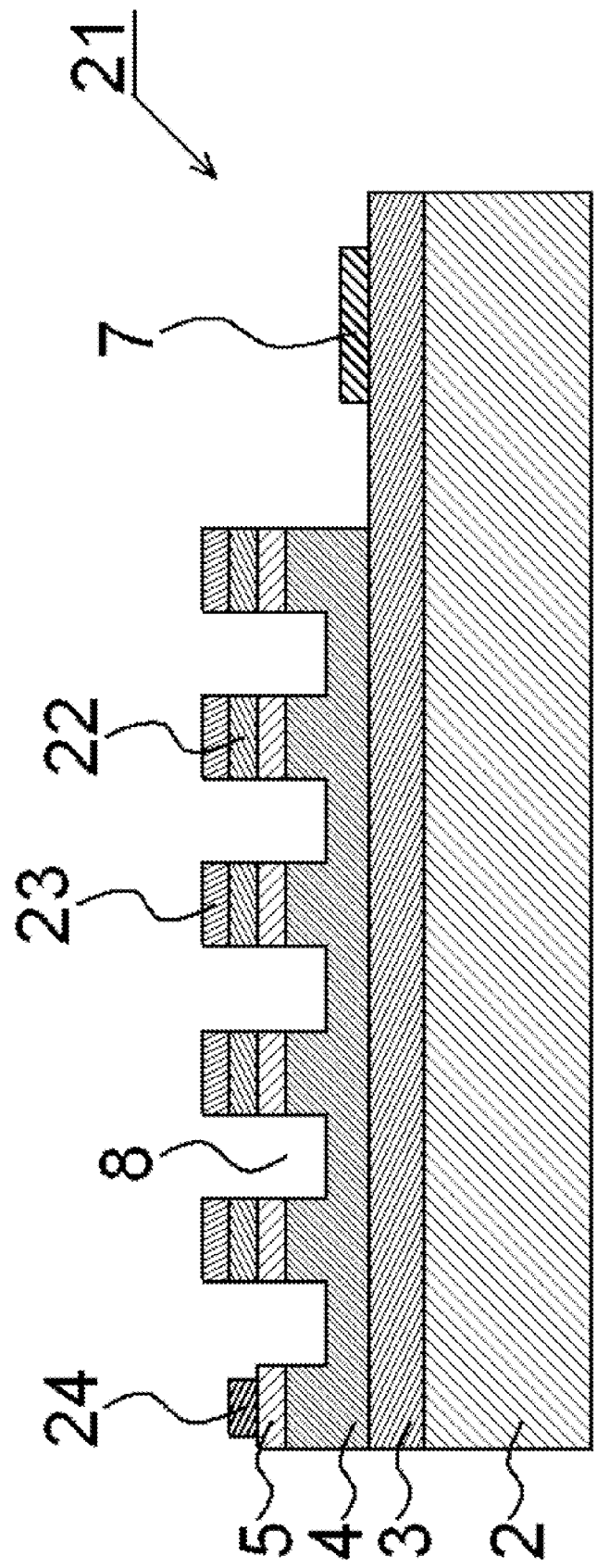
FIG. 8 is an outline cross-sectional view of a semiconductor light receiving element according to a second exemplary embodiment of the present invention.

Next, a description is given concerning a semiconductor light receiving element according to the second exemplary embodiment of the present invention. FIG. 8 shows an outline cross-sectional view of the semiconductor light receiving element according to the second exemplary embodiment of the present invention. The first exemplary embodiment shown in FIG. 1 and FIG. 2 has a structure in which the second electrode 6 combines a role as an electro-conductive layer having a periodic structure inducing surface plasmon resonance (the second electrode and the electro-conductive layer are combined to be denoted as "second electrode"), but in the second exemplary embodiment, a second electrode 24 and a electro-conductive layer 23 having a periodic structure inducing surface plasmon resonance are configured separately.

The second electrode 24 is formed on a part of a semiconductor layer 5 of the second conductivity type, and the electro-conductive layer 23 is formed via an insulating layer 22, on the semiconductor layer 5 of the second conductivity type where the second electrode 24 is not formed. That is, the second electrode 24 and the electro-conductive layer 23 are not in electrical contact. $SiO_2$, SiON, SiN, and the like, for example, are preferable as a material of the insulating layer 22. The thickness of the insulating layer 22 is appropriately set according to process compatibility, incident light wavelength, and various other design parameters, and, for example, is preferably 10 nm to 100 nm, and more preferably approximately 50 nm. The openings 8 pass through the electro-conductive layer 23, the insulating layer 22, and the semiconductor layer 5 of the second conductivity type, and reach as far as the middle of the non-doped semiconductor light absorbing layer 4. In this type of configuration according to the second exemplary embodiment, it is possible to obtain a surface plasmon resonance effect similar to the first exemplary embodiment.

Figure 9:
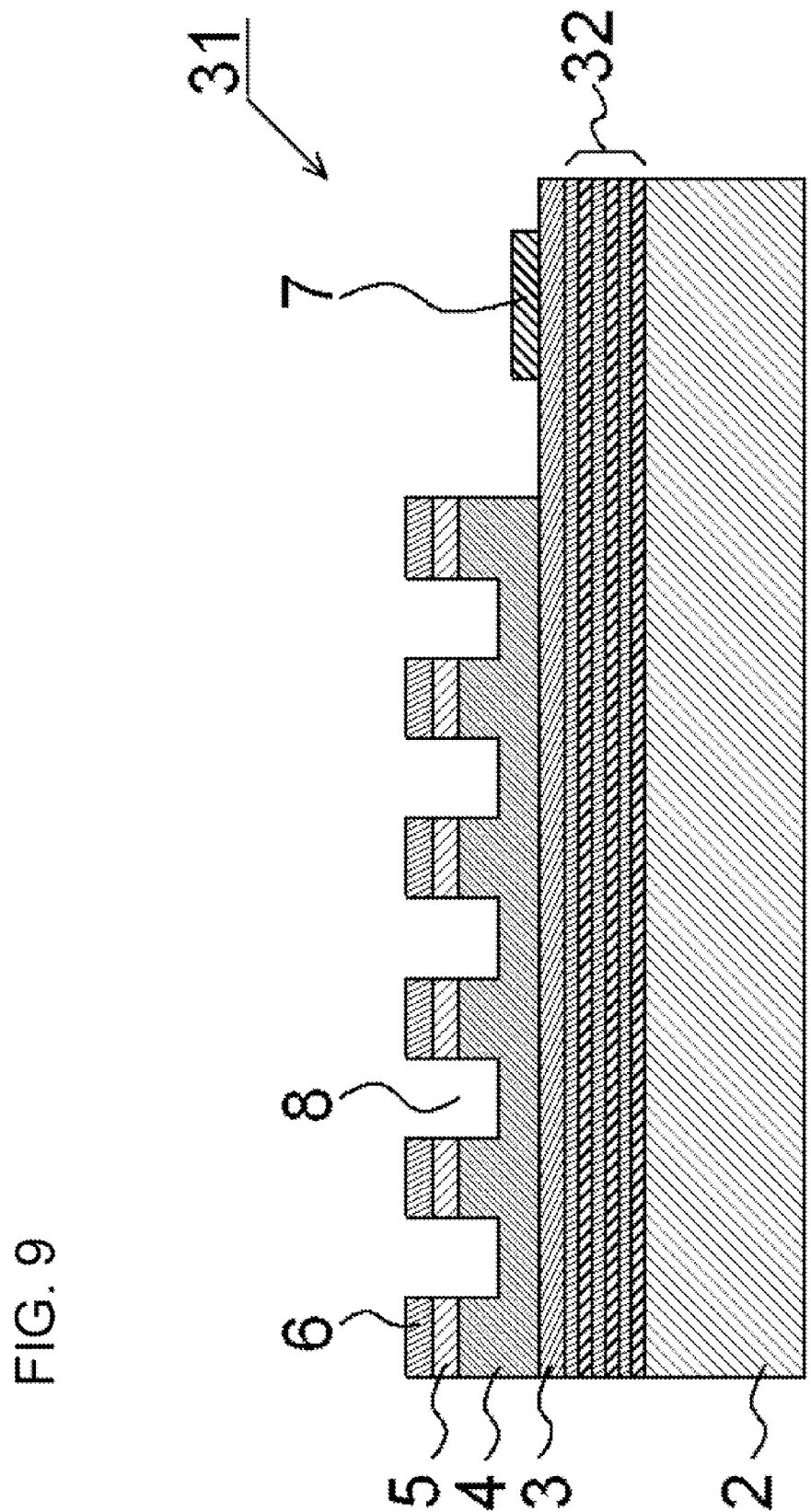
FIG. 9 is an outline cross-sectional view of the semiconductor light receiving element according to a third exemplary embodiment of the present invention.

Next, a description is given concerning a semiconductor light receiving element according to a third exemplary embodiment of the present invention. FIG. 9 shows an outline cross-sectional view of the semiconductor light receiving element according to the third exemplary embodiment of the present invention. With regard to a difference from the first exemplary embodiment, in the third exemplary embodiment a Bragg reflection multi-layer film 32 is provided between a substrate 2 and a semiconductor layer 3 of a first conductivity type. With regard to other points, the semiconductor light receiving element 31 is similar to the semiconductor light receiving element 1 according to the first exemplary embodiment shown in FIG. 1 and FIG. 2.

With the semiconductor light receiving element of the present invention, it is possible to confine light in a non-doped semiconductor light absorbing layer, using surface plasmon resonance, but even with this there are certain components that pass through or are reflected. According to the present exemplary embodiment, by providing the Bragg reflection multi-layer film 32, a Fabry-Perot resonator is formed between a second electrode 6 and the Bragg reflection multi-layer film 32, and it is possible to further improve quantum efficiency (for example, 90% or more quantum efficiency is possible).

Here, a description has been given of the third exemplary embodiment based on the first exemplary embodiment in which the second electrode 6 also serves as the conductive layer having the periodic structure, but in the third exemplary embodiment, clearly, application is also possible to the second exemplary embodiment in which the second electrode and the conductive layer are configured separately.

Figure 10:
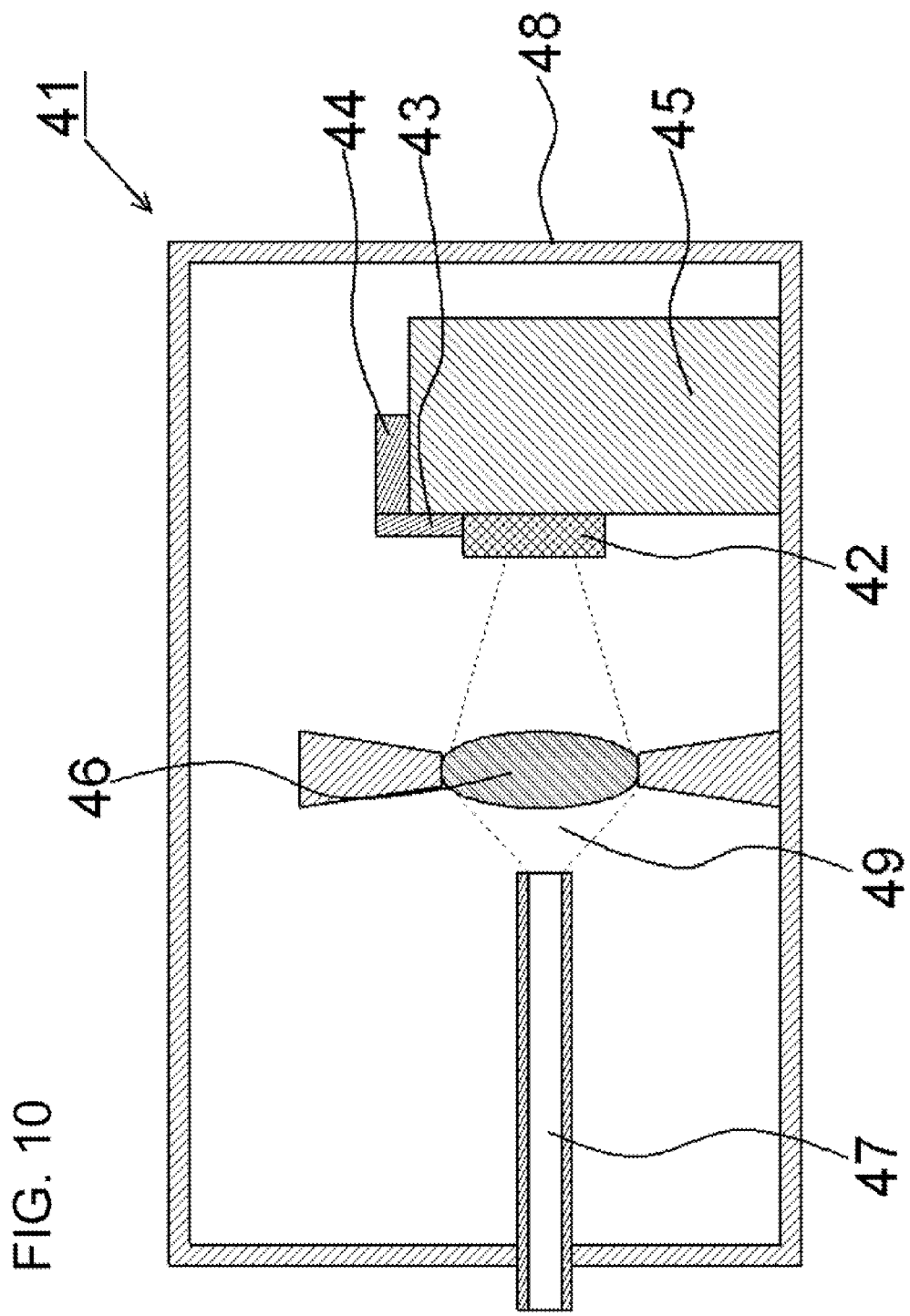
FIG. 10 is an outline cross-sectional view of an optical communication device according to a fourth exemplary embodiment.

Next, as an optical communication device according to a fourth exemplary embodiment of the present invention, a description is given concerning an optical communication device in which a semiconductor light receiving element of the present invention is installed. FIG. 10 is an outline cross-sectional view of the optical communication device according to the fourth example. The optical communication device 41 is an optical receiver module, and can be an optical receiver module for 40 Gbps transmission, for example. The optical communication device 41 includes the semiconductor light receiving element 42 of the present invention, electrical wiring 43, a pre-amplifier IC 44, a chip carrier 45, a lens 46, and an optic fiber 47, inside a module casing 48. The semiconductor light receiving element 41 is installed on the chip carrier 45, and optical coupling is performed by the optic fiber 47 and the lens 46. Furthermore, the semiconductor light receiving element 41 is in electrical contact with the pre-amplifier IC 44 of a later stage by the electrical wiring 43. If the semiconductor light receiving element 41 of the present invention is disposed so that light is radiated from a substrate side, photoelectric conversion with good efficiency is possible. It should be noted that disposition is also possible such that light is radiated from a second electrode or a conductive layer side. In a case of using transmission by near infrared light of wavelength 1.55 μm, in the semiconductor light receiving element 41 according to the present invention it is possible to use a substrate in which Ge is epitaxially grown on Si or a chemical compound semiconductor substrate. In the present exemplary embodiment, if the semiconductor light receiving element 41 according to the present invention is used, since it is possible to enlarge light receiving area, there is an advantage in that combining tolerance can be broadened.

Figure 11:
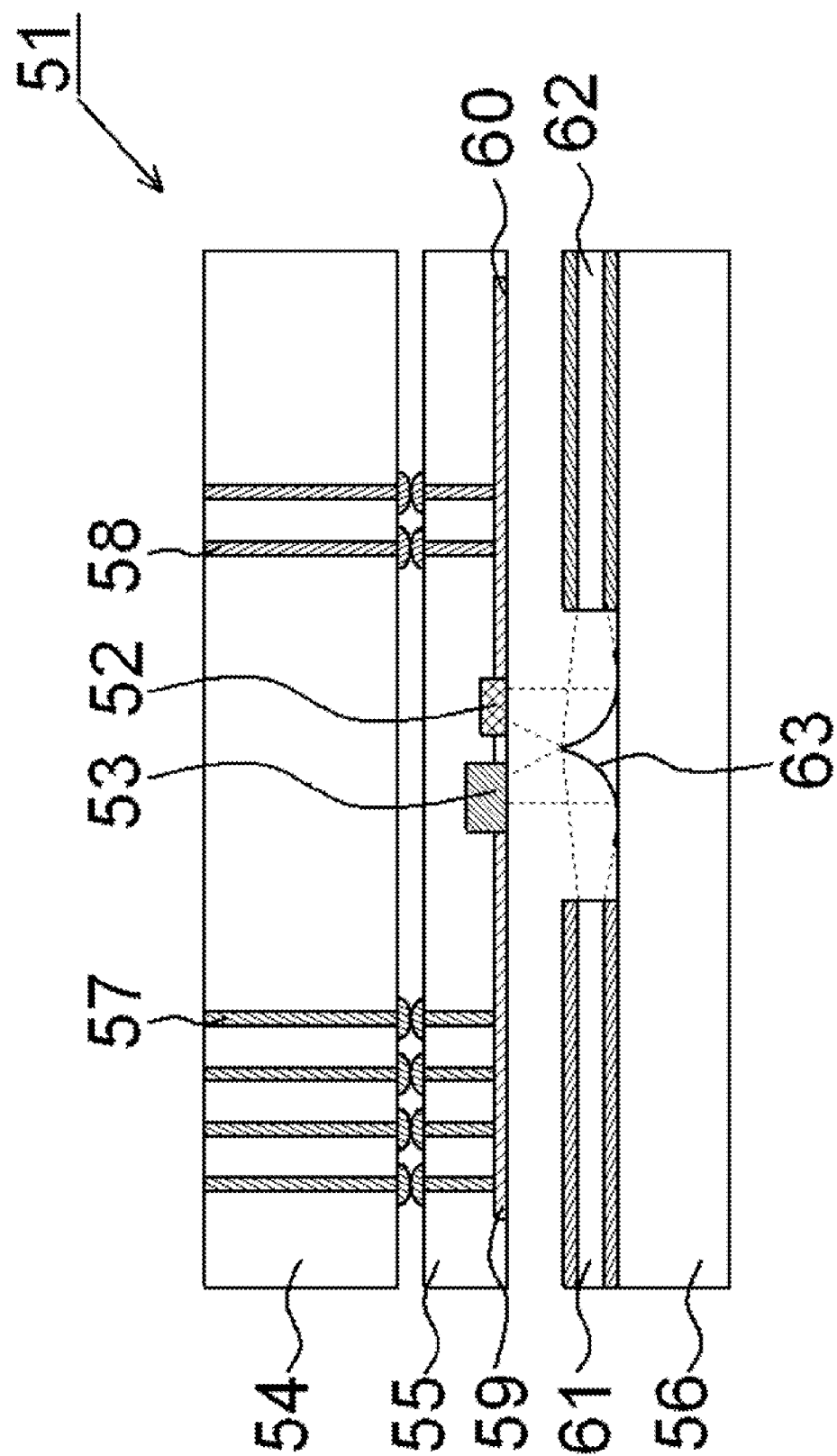
FIG. 11 is an outline cross-sectional view of the optical communication device according to a fifth exemplary embodiment.

Next, as an optical communication device according to a fifth exemplary embodiment of the present invention, a description is given concerning a connection mode of a semiconductor light receiving element of the present invention and the optical communication device. FIG. 11 shows an outline cross-sectional view of the optical communication device (in particular, interconnection between LSI chips) according to the fifth example. The optical communication device 51 is provided with an LSI package 54 as a semiconductor device, a semiconductor light receiving element/light source mounting board 55 on which the semiconductor light receiving element 52 of the present invention and a VCSEL light source are mounted, and an LSI mounting board 56 on which a concave mirror 63 and optical signal fibers 61 and 62 are mounted. An optical signal from the optical signal input fiber 62 is radiated on the semiconductor light receiving element 52 by the concave mirror 63. The semiconductor light receiving element 52 flows a current corresponding to the optical signal to the LSI package 54 via an electrical wiring layer 60 for the semiconductor light receiving element and an electrical wiring via 58 for the semiconductor light receiving element that is electrically connected to the electrical wiring layer 60 for the semiconductor light receiving element. Here, for input of the optical signal, instead of the optical signal input fiber 62 it is possible to use another means that is generally known such as a planar optical waveguide. Furthermore, instead of the concave mirror 63, it is possible to use a light focusing mechanism such as a convex lens or the like. Furthermore, it is possible to dispose a pre-amplifier for electrical signal amplification on the electrical wiring layer 60 for the semiconductor light receiving element.

The electrical signal from the LSI package 54 passes from an electrical wiring via 57 for light source/modulation, through an electrical wiring layer 59 for light source/modulation, and is converted into an optical signal by a VCSEL (surface emitting laser) light source 53 having an electrical modulation structure. The optical signal is reflected by the concave mirror 63 and sent to an optical signal output fiber 61. The VCSEL light source 53 that is provided with the electrical modulation structure can be replaced with another known structure that modulates light by electricity, for example, a Mach Zehnder type modulator that modulates light from an external light source by an electro-optic effect or a thermo-optic effect.

It should be noted that, in the fifth exemplary embodiment also, light radiation to the semiconductor light receiving element can be performed from a substrate side, and from a second electrode or conductive layer side, but radiating from the substrate side can perform photoelectric conversion more efficiently.

FIRST EXAMPLE

Figure 12:
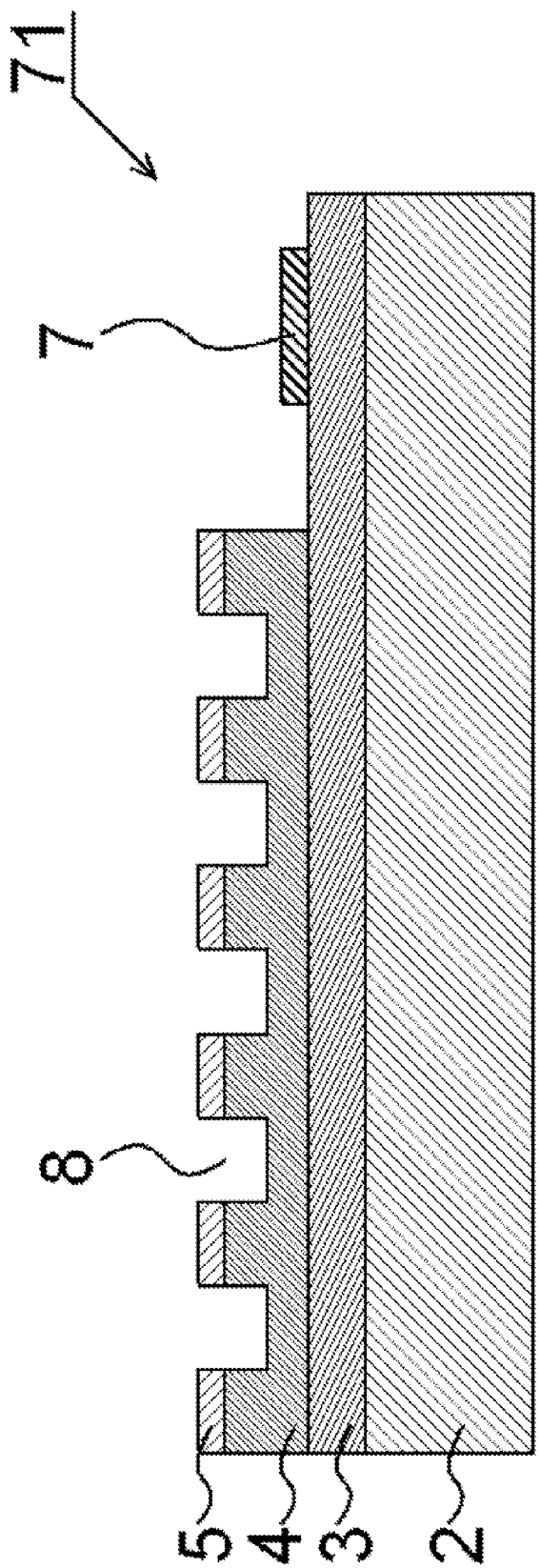
FIG. 12 is an outline cross-sectional view of the semiconductor light receiving element according to a comparative example in a first example.

In order to show that quantum efficiency improves by getting a preferable range of a period P of the openings and using a surface plasmon resonance, an electromagnetic field simulation was carried out. A simulation model of a semiconductor light receiving element of the present invention is a model according to the first exemplary embodiment as shown in FIG. 2 and FIG. 6; with wavelength λ of incident light in a vacuum as 1550 nm, the thickness of a non-doped semiconductor light absorbing layer being relatively thin at 250 nm, the shape of the openings being square, the width (length) w of one side of an opening being half a period P, and the proportion of total area of the openings to area (including the openings) of a second electrode being 25%, the simulation was carried out by a setting making light from a substrate side incident. Furthermore, as a comparative example, as shown in FIG. 12, simulation was carried out also for a semiconductor light receiving element 71 in which an electro-conductive layer having a periodic structure that induces surface plasmon resonance is not present. It is to be noted that in the comparative example, the second electrode (not shown in the drawings) is not present in a light receiving portion, but is provided at a place a little separate from the light receiving portion. Furthermore, incident light is from the substrate side also in the setting for the comparative example.

Figure 13:
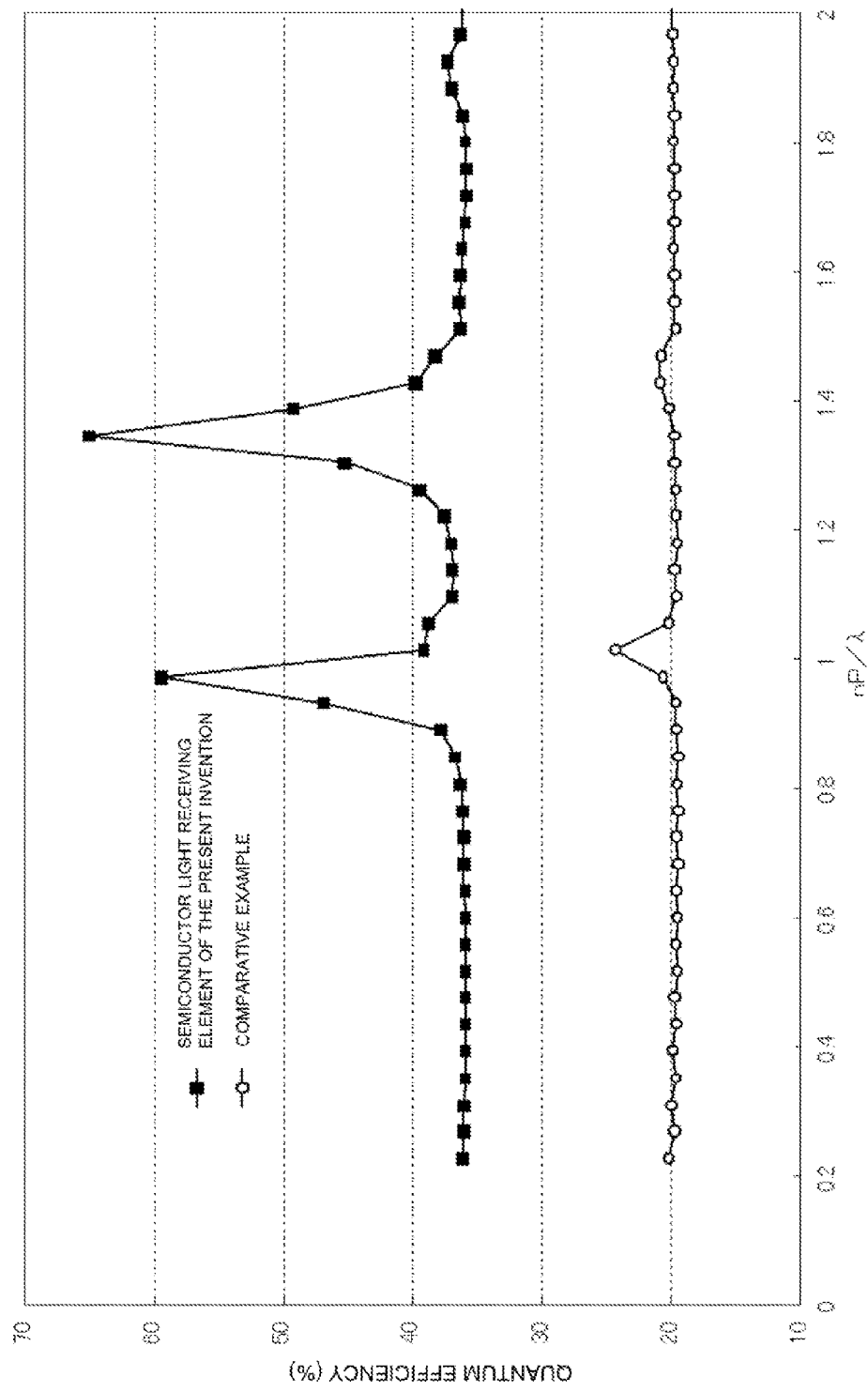
FIG. 13 is an electromagnetic field simulation result with respect to the first example.

FIG. 13 shows an electromagnetic field simulation result. In FIG. 13, with a refractive index of a semiconductor layer of a second conductivity type as n, and taking values that normalize the period P by λ/n on the abscissas, the quantum efficiency is on the ordinate. It is to be noted that, when the period P becomes large, the proportion of the total area of the openings is constant, and the length w of one side of the openings is made proportional to the period P and is made large.

According to the simulation result, there are two peaks according to the surface plasmon resonance, and when a condition of $0.9 < nP/\lambda < 1.1$ or $1.2 < nP/\lambda < 1.5$ is satisfied, a significant effect is obtained with regard to the quantum efficiency, and it is understood a quantum efficiency of approximately 3 times that of the comparative example is possible. Furthermore, for portions outside of the resonance peaks also, a higher efficiency than the comparative example is obtained. This is because, in a case of incident light from the substrate side, since almost no light passes through openings of a size less than or equal to the wavelength, the second electrode acts a role also as a mirror at the same time.

The present invention has been described based on the abovementioned exemplary embodiments, but there is no limitation to the abovementioned exemplary embodiments, and clearly various changes, modifications, improvements, and the like within the scope of the invention are included. Furthermore, various combinations, substitutions and selections of disclosed elements are possible within the scope of the present invention.

Further issues, objects and expanded modes of the present invention are clear from the entire disclosed matter of the present invention including the claims.

EXPLANATIONS OF SYMBOLS 1, 11, 21, 31 semiconductor light receiving element
2 substrate
2a convex portion
3 semiconductor layer of a first conductivity type
4 non-doped semiconductor light absorbing layer
5 semiconductor layer of a second conductivity type 6 second electrode (conductive layer)
7 first electrode
8 opening
12 embedded oxide layer
13, 14 buffer layer
22 insulating layer
23 (electro-)conductive layer
24 second electrode
32 Bragg reflection multi-layer film
41 optical communication device
42 semiconductor light receiving element
43 electrical wiring
44 pre-amplifier IC
45 chip carrier
46 lens
47 optic fiber
48 module casing
49 signal light
51 optical communication device
52 semiconductor light receiving element
53 VCSEL light source
54 LSI package
55 semiconductor light receiving element/light source mounting board
56 LSI mounting board
57 electrical wiring via for light source/modulation
58 electrical wiring via
59 electrical wiring layer for light source/modulation
60 electrical wiring layer for semiconductor light receiving element
61 optical signal output fiber
62 optical signal input fiber
63 concave mirror
71 semiconductor light receiving element (comparative example)

What is claimed is:

1. A semiconductor light receiving element comprising:
a substrate;
a semiconductor layer of a first conductivity type formed on said substrate;
a non-doped semiconductor light absorbing layer formed on said semiconductor layer of said first conductivity type;
a semiconductor layer of a second conductivity type formed on said non-doped semiconductor light absorbing layer; and
a metal layer formed on said semiconductor layer of said second conductivity type; wherein
a plurality of openings, periodically arrayed, are formed in a laminated body composed of said metal layer, said semiconductor layer of said second conductivity type, and said non-doped semiconductor light absorbing layer,
widths of said openings are less than or equal to incident light wavelength,
said openings pass through said metal layer and said semiconductor layer of said second conductivity type to reach said non-doped semiconductor light absorbing layer,
a non-opened region of said metal layer is provided on a non-opened region of said non-doped semiconductor light absorbing layer, and
light is incident from a side of said substrate, the semiconductor light receiving element further comprising:

a first electrode, formed on said semiconductor layer of said first conductivity type, and also electrically connected to said semiconductor layer of said first conductivity type; and
a second electrode, formed on said semiconductor of said second conductivity type, and also electrically connected to said semiconductor layer of said second conductivity type; wherein
said metal layer is formed on said semiconductor layer of said second conductivity type via an insulating layer, in a region where said second electrode is not formed; and
said metal layer and said second electrode are not electrically connected.

2. The semiconductor light receiving element according to claim 1, wherein said plurality of openings are periodically arrayed such that surface plasmon resonance is generated at an interface of said metal layer and said semiconductor layer of said second conductivity type.

3. The semiconductor light receiving element according to claim 1, wherein,
when a depth of said openings is d, a thickness of said metal layer is $t_1$, a thickness of said semiconductor layer of said second conductivity type is $t_2$, and a thickness of said non-doped semiconductor light absorbing layer is $t_3$, said depth d of said openings satisfies a condition: $t_1+t_2 \leq d \leq t_1+t_2+t_3/2$.

4. The semiconductor light receiving element according to claim 1, further comprising:
a first electrode, formed on said semiconductor layer of said first conductivity type, and also electrically connected to said semiconductor layer of said first conductivity type; wherein
said metal layer is electrically connected to said semiconductor layer of said second conductivity type, and functions as a second electrode.

5. The semiconductor light receiving element according to claim 1, wherein
at least a part of a face of said substrate, on a side opposite a face on which said semiconductor layer of said first conductivity type is formed, is formed in a lens shape.

6. The semiconductor light receiving element according to claim 1, wherein
said plurality of openings are periodically arrayed in a triangular grid form or a square grid form, and
a surface shape of said openings is a circular shape, an elliptical shape, or a polygonal shape.

7. The semiconductor light receiving element according to claim 1, wherein
a proportion of a total area of said plurality of openings with respect to an area (including an area of said openings) of an upper face of said metal layer is 50% or more and 80% or less.

8. The semiconductor light receiving element according to claim 1, wherein,
when said incident light wavelength is $\lambda$, a refractive index of said semiconductor layer of said second conductivity type is n, and a period of said openings, which is a distance between centers of said openings that are adjacent, is P, $nP/\lambda$ satisfies a condition of $0.9 < nP/\lambda < 1.1$ or $1.2 < nP/\lambda < 1.5$.

9. The semiconductor light receiving element according to claim 1, further comprising a Bragg reflection multi-layer film in a layer below said semiconductor layer of said first conductivity type.

10. The semiconductor light receiving element according to claim 1, wherein said metal layer includes at least one metallic material from among Al, Ag, Au, and Cu.

11. The semiconductor light receiving element according to claim 1, wherein
said non-doped semiconductor light absorbing layer is formed from at least one selected from a group of Si, $Si_xGe_{1-x}$ (x is a positive number less than 1), Ge, GaN, GaAs, GaInAs, GaInP, and InP.

12. The semiconductor light receiving element according to claim 1, further comprising an antireflective film or a protective film on said metal layer.

13. An optical communication device comprising a semiconductor light receiving element, wherein said semiconductor light receiving element comprises:
a substrate;
a semiconductor layer of a first conductivity type formed on said substrate;
a non-doped semiconductor light absorbing layer formed on said semiconductor layer of said first conductivity type;
a semiconductor layer of a second conductivity type formed on said non-doped semiconductor light absorbing layer; and
a metal layer formed on said semiconductor layer of said second conductivity type; wherein
a plurality of openings, periodically arrayed, are formed in a laminated body composed of said metal layer, said semiconductor layer of said second conductivity type, and said non-doped semiconductor light absorbing layer,
widths of said openings are less than or equal to incident light wavelength,
said openings pass through said metal layer and said semiconductor layer of said second conductivity type to reach said non-doped semiconductor light absorbing layer,
a non-opened region of said metal layer is provided on a non-opened region of said non-doped semiconductor light absorbing layer, and
light is incident from a side of said substrate, the semiconductor light receiving element further comprising:
a first electrode, formed on said semiconductor layer of said first conductivity type, and also electrically connected to said semiconductor layer of said first conductivity type; and
a second electrode, formed on said semiconductor of said second conductivity type, and also electrically connected to said semiconductor layer of said second conductivity type; wherein
said metal layer is formed on said semiconductor layer of said second conductivity type via an insulating layer, in a region where said second electrode is not formed; and
said metal layer and said second electrode are not electrically connected.

14. The optical communication device according to claim 13, wherein said semiconductor light receiving element is disposed so that said light is incident from said side of said substrate and comprises a lens to focus said light.

* * * * *